(12) United States Patent
Zellner et al.

(10) Patent No.: US 7,528,623 B2
(45) Date of Patent: May 5, 2009

(54) DISTRIBUTING DATA AMONG TEST BOARDS TO DETERMINE TEST PARAMETERS

(75) Inventors: Alexander Zellner, Ingolstadt (DE); Jeffrey S. Benagh, Melrose, MA (US)

(73) Assignee: Teradyne, Inc., North Reading, MA (US)

( * ) Notice: Subject to any disclaimer, the term of this patent is extended or adjusted under 35 U.S.C. 154(b) by 0 days.

(21) Appl. No.: 11/670,750

(22) Filed: Feb. 2, 2007

(65) Prior Publication Data
US 2008/0189060 A1    Aug. 7, 2008

(51) Int. Cl.
*G01R 31/00*    (2006.01)
(52) U.S. Cl. ...................................... 324/770
(58) Field of Classification Search .................. 324/770
See application file for complete search history.

(56) References Cited

U.S. PATENT DOCUMENTS

| | | | |
|---|---|---|---|
| 5,870,037 A * | 2/1999 | Okazaki et al. | 341/58 |
| 6,781,403 B2 * | 8/2004 | Kim | 324/770 |
| 6,981,086 B2 | 12/2005 | Wetzel et al. | |
| 2003/0005375 A1 | 1/2003 | Krech et al. | |
| 2003/0084388 A1 * | 5/2003 | Williamson et al. | 714/25 |
| 2004/0193990 A1 | 9/2004 | Ichiyoshi | |

FOREIGN PATENT DOCUMENTS

WO    WO2005/114236    12/2005

OTHER PUBLICATIONS

International Search Report and Written Opinion in Application No. PCT/US2008/052243, dated Jun. 20, 2008.

* cited by examiner

*Primary Examiner*—Ha Tran Nguyen
*Assistant Examiner*—Shaun Campbell
(74) *Attorney, Agent, or Firm*—Fish & Richardson P.C.

(57) ABSTRACT

A system for testing a liquid crystal display (LCD) driver includes multiple test boards, each which includes multiple channels that correspond to data channels of fee LCD driver, a device interface board that acts as an interface between the multiple test boards and the LCD driver, a computing device configured to communicate with the multiple test boards, and one or more communications buses over which the computing device communicates with the multiple test boards. Each of the multiple test boards receives partial test data from data channels of the LCD driver, and processes the partial test data to obtain a partial result; and each of the multiple test boards shares a partial result determined from corresponding partial test data with one or more others of the multiple test boards.

24 Claims, 5 Drawing Sheets

DISTRIBUTING DATA AMONG TEST BOARDS TO DETERMINE TEST PARAMETERS

TECHNICAL FIELD

This patent application relates generally to testing a device, such as a liquid crystal display (LCD) driver and, more particularly, to distributing data among multiple test boards so that each test board has a set of data from which to determine one or more test parameters.

BACKGROUND

Automatic test equipment (ATE) is typically an automated, usually computer-driven, system for testing devices, such as semiconductors, electronic circuits, and printed circuit board assemblies. A device being tested is referred to as a device under test (DUT). Modern ATE supports multi-site testing. ATE that supports multi-site testing includes a testing device (or "tester) feat has multiple sites. ATE generally includes multiple instrument slots (or boards) for each site.

During testing, a DUT is inserted into each site, and the ATE performs tests on the device in the site. Ideally, each instrument slot has enough channels to accommodate corresponding pins on a DUT. In some cases, however, the number of pins on the DUT exceeds the number of channels in an instrument slot. As a result, the DUT spans more than one instrument board. In such cases, a test board on the ATE may be unable to obtain a full set of test data from the DUT. That is, because the DUT spans multiple test boards, some DUT pins provide test dais to one test board and other DUT pins provide test data to one or more other test boards. This can be problematic in testing scenarios that require a test board to have a full set of test data from the DUT.

SUMMARY

This patent application describes methods and apparatus, including computer program products, for distributing data among multiple test boards of ATE so that each test board has a set of data from which to determine one or more test parameters.

In general, in one aspect, this patent application describes an apparatus for testing a device. The apparatus comprises a first site comprising first channels for receiving first test data from the device, and a first processing device configured to process the first test data to produce a first partial result. The apparatus also comprises a second site comprising second channels for receiving second test data from the device, and a second processing device configured to process the second test data to produce a second partial result. There is an electrical connection between the first site and tire second site, winch enables communication between the first site and the second site. The first processing device is configured to receive the second partial result and to use the second partial result and the first partial result to determine a test parameter for the first test data and the second test data. This aspect may include one or more of the following features.

The second processing device may be configured to receive the first partial result and to use the first partial result and the second partial result to determine the test parameter for the first lest data and the second test data. The apparatus may further comprise a first circuit board comprising the first site and the first processing device. The first circuit board comprises multiple slots to receive corresponding pins. Each of slots may correspond to a channel. A second circuit board may comprises the second site and the second processing device. The second circuit board comprises multiple slots to receive corresponding pins. Each of the slots may correspond to a channel.

The first test data may comprise one to four values per pin, and the first partial result may comprise one to four results. The one to four results may comprise one result for each of the one to four values of the first test data. The second test data may comprise one to four values per pin. The second partial result may comprise one to tour results. The one to four results may comprise one result for each of the one to four values of the second test data.

The processing performed by the first processing device may comprise at least one of taking a minimum of values of the first test data, taking a maximum of values of the first test data, and taking an average of values of the first test data. The processing performed by the second processing device may comprise at least one of taking a minimum of values of the second test data, taking a maximum of values of the second lest data, and taking an average of values of the second test data.

The first processing device may be configured to identify a number of channels on the device, to obtain a number of channels used to produce the second test data, and to determine whether an additional partial result is needed to obtain a test parameter for all channels of the device. The determining may be performed based on the number of channels on the device and the number of channels used to produce the second test data.

The second processing device may be configured to provide, to the first processing device, the number of channels used to produce the second test data.

In general, in another aspect, this patent application describes a system for testing a liquid crystal display (LCD) driver, which comprises multiple test boards, each which includes multiple channels that correspond to data channels of the LCD driver, a device interlace board that acts as an interface between the multiple test boards and the LCD driver, a computing device configured to communicate with the multiple test boards, and one or more communications buses over which the computing device communicates with the multiple test boards. Each of the multiple test boards is configured to receive partial test data from data channels of the LCD driver, and to process the partial test data to obtain a partial result, and each of the multiple test boards is configured to share a partial result determined from corresponding partial test data with one or more others of the multiple test boards. The system may include one or more of the following features.

Each of the multiple test boards maybe configured to process multiple partial results in order to obtain a complete result for the LCD driver. The complete result takes into account test data from channels of different test boards. At least one of the multiple test boards may be configured to communicate the complete result to the computing device. The partial test data corresponding to each of the multiple test boards may comprise individual codes per channel. At least some of the individual codes may be obtained by applying signals differently to arrive at the codes. Applying signals differently may comprise at least one of obtaining a code by progressing from a maximum signal value to a value of the code, and progressing from a minimum signal value to the value of the code.

The partial test data corresponding to each of the multiple test boards may comprise individual codes per channel. At least some of the individual codes may be obtained by different mechanical application of signals to arrive at the codes. Each of the multiple test boards may be configured to process multiple partial results to obtain a test parameter. Each of the multiple test boards may comprise programmable logic configured to processes the partial test data to obtain a partial result.

Each of the multiple test boards may be configured to share partial test data with one or more others of the multiple test boards so that each of the multiple test boards has a complete set of test data for the LCD driver. At least one of the multiple test boards may be configured to process the complete set of test data to obtain a test parameter.

In general, in another aspect, this patent application describes a method of testing a device, which comprises receiving first test data from the device, where die first test data is received from a first subset of channels on the device, processing the first test data at a first test board to produce a first partial result, receiving second test data from the device, where the second test data is received from a second subset of channels on the device, processing the second test data at a second test board to produce a second partial result, processing the first partial result and the second partial result at the first test board to produce a first test parameter, and processing the first partial result and the second partial result at the second test board to produce a second test parameter. This aspect may also include one or more of the following features.

Processing the first partial result and the second partial result may comprise at least one of taking minimums of values of the first and second test data, taking maximums of values of the first and second test data, and taking an average of values of the first and second test data. The first partial test data and the second partial test data may comprise individual codes per channel, at least some of which are obtained by applying signals differently to arrive at the codes. Applying signals differently may comprise at least one of obtaining a code by progressing from a maximum signal value to a value of the code, and progressing from a minimum signal value to the value of the code.

The method may also include, in the second test board, identifying a number of channels on the device, obtaining a number of channels used to produce the second test data, and determining whether an additional partial result is needed to obtain a test parameter for all channels of die device. The determining may performed based on the number of channels on the device and the number of channels used to produce the second test data. The first test parameter and the second test parameter comprise a same test parameter (e.g., both maximums) or different test parameters (e.g., maximum and average) having the same or different values.

The details of one or more examples are set forth in the accompanying drawings and the description below. Further features, aspects, and advantages will become apparent from the description, the drawings, and the claims.

DETAILED DESCRIPTION

Figure 1:
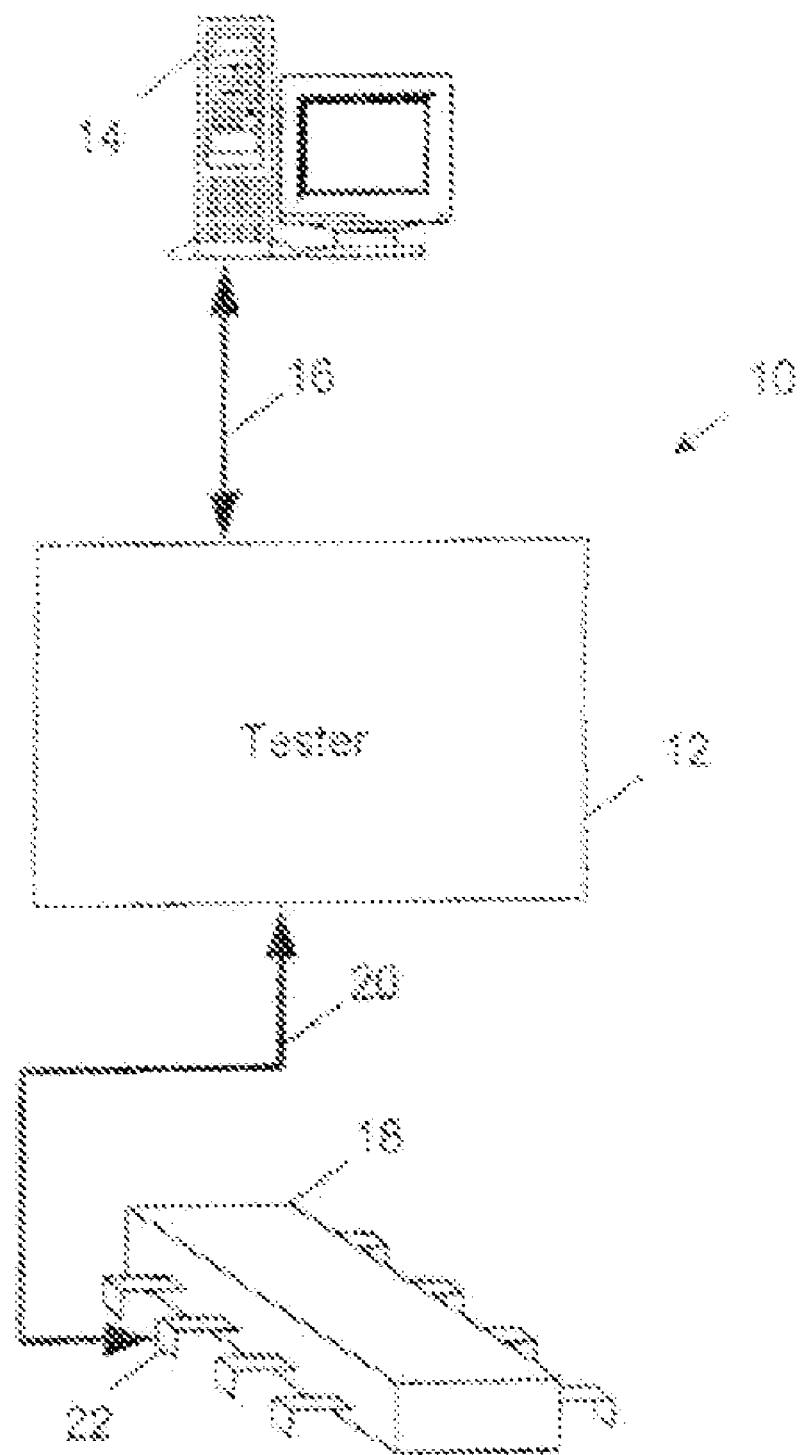
FIG. 1 is a block diagram of ATE for testing devices (DUTs).

FIG. 1 shows a system 10 for testing a device-under-test (DUT) 18, such as a semiconductor device. System 10 includes a tester 12, such as automatic test equipment (ATE) or other similar testing device. To control tester 12, system 10 includes a host processing system, such as a computer system 14, that interfaces with tester 12 over a hardwire connection 16. Typically, computer system 14 sends commands to tester 12 that initiate execution of routines and functions for testing DUT 18. Such executing test routines may initiate generation and transmission of test signals to the DUT 18 and collect responses from the DUT. Various types of DUTs may be tested by system 10. For example, DUTs may be semiconductor devices such as an integrated circuit (IC) chip (e.g., a liquid crystal display (LCD) driver, a memory chip, a microprocessor, an analog-to-digital converter, a digital-to-analog converter, etc.).

To provide test signals and collect responses from the DUT, tester 12 is connected to one or more connector pins that provide an interface for the internal circuitry of DUT 18. The pins correspond to data channels of the DUT. Connections other than pins may be used. To test some DUTs, such as an LCD driver, as many as 480 pins (or more) may be interfaced to tester 12. For illustrative purposes, in this example, semiconductor device tester 12 is connected to one connector pin of DUT 18 via a hardwire connection. A conductor 20 (e.g., cable) is connected to pin 22 and is used to deliver test signals (e.g., PMU test signals, PE test signals, etc.) to the internal circuitry of DUT 18. Conductor 20 also senses signals at pin 22 in response to the test signals provided by semiconductor device tester 12. For example, a voltage signal or a current signal may be sensed at pin 22 in response to a test signal and sent over conductor 20 to tester 12 for analysis.

Figure 2:
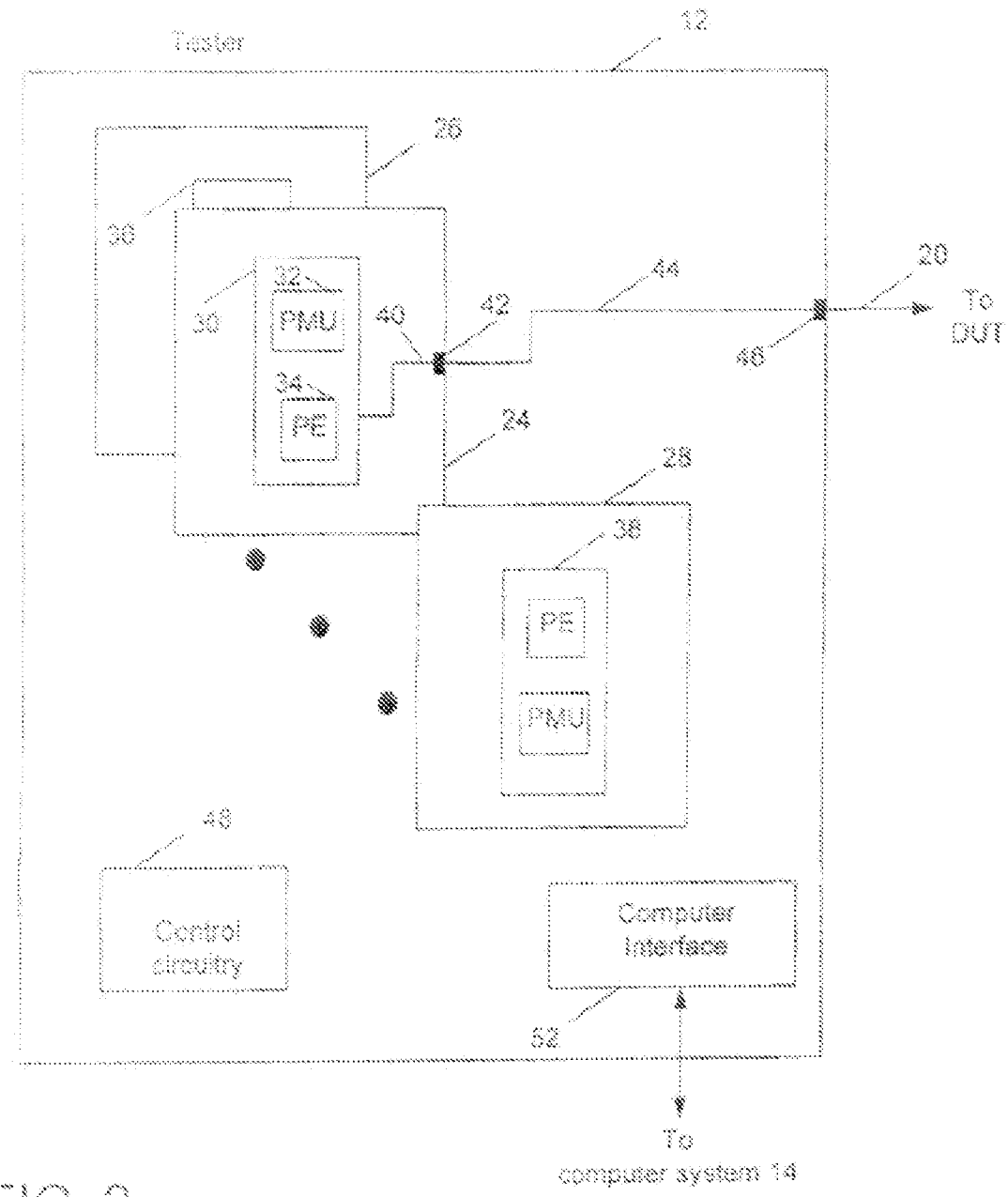
FIG. 2 is a block diagram of a tester used in the ATE.

Referring also to FIG. 2, to send and collect test signals from multiple connector pins of a DUT (or multiple DUTs), semiconductor device tester 12 includes an interface board 24 that can communicate with numerous pins. Interface board 24 is a circuit board that includes circuitry for processing and communication, interlace board 24 may transmit test signals to, e.g., 32, 64, 128, 256 pins and collect corresponding responses. Each communication link to a pin corresponds to a communication channel. By providing test signals to a number of channels, testing time is reduced, since multiple tests may be performed simultaneously. Along with having many channels on as interface board, by including multiple interface boards in tester 12, the overall number of channels increases, thereby further reducing testing time. In this example, two additional interface boards 26 and 28 are shown to demonstrate that multiple interface boards may populate tester 12. Interlace boards 26 and 28 arc circuit boards of the same type as interface board 12, which include circuitry for processing and communication.

Each interface board includes a dedicated integrated circuit (IC) chip (e.g., a field programmable gate army (FPGA)) for performing particular test functions. For example, interface board 24 may include an IC chip 30 for performing parametric measurement unit (PMU) tests and pin electronics (PE) tests. IC chip 30 has a PMU stage 32 that includes circuitry for performing PMU tests and a PE stage 34 that includes circuitry for performing PE tests. Additionally, interface boards 26 and 28 respectively include IC chips 36 and 38 that include PMU and PE circuitry. Typically PMU testing involves providing a DC voltage or current signal to the DUT to determine such quantities as input and output impedance, current leakage, and other types of DC performance characterizations. PE testing involves sending AC test signals, or waveforms, to a DUT 18 and collecting responses to further characterize the performance of the DUT.

To pass both DC and AC test signals from interface board 24 to DUT 18, one or more conducting traces 40 connect IC chip 30 to an interface board connector 42 that allows signals to be passed on and off interlace board 24. Interface board connector 42 is also connected to one or more conductors 44 that are connected to an interface connector 46, which allows signals to be passed to and from tester 12. In this example, conductor 20 is connected to interface connector 46 for bi-directional signal passage between tester 12 and pin 22 of DUT 18. In some arrangements, an interface device may be used to connect one or more conductors from, tester 12 to the DUT. For example, the DUT (e.g., DUT 18) may be mounted onto a device interlace board (DIB) for providing access to each DUT pin. In such an arrangement, conductor 20 may be connected to the DIB for placing test signals on the appropriate pin(s) (e.g., pin 22) of the DUT.

IC chip 30 (along with IC chips 36 and 38) typically has multiple pin connections, such as individual slots, (e.g., eight, sixteen, etc.) that are connected with multiple conducting traces and corresponding conductors for providing and collecting signals from the DUT (via a DIB). In same arrangements, tester 12 may connect to two or more DIB's for interfacing the channels provided by interface boards 24, 26, and 28 to one or multiple devices under test.

To initiate and control the testing performed by interface boards 24, 26, and 28, tester 12 includes control circuitry 48 that provide test parameters (e.g., test signal voltage level, test signal current level, digital values, etc.) for producing test signals and analyzing DUT responses. Control circuitry 48 may be implemented using one or more processing devices. Examples of processing devices include, but are not limited to, a microprocessor, a microcontroller, programmable logic (e.g., an FFGA), and/or combination(s) thereof. Tester 12 also includes a computer interface 52 that allows computer system 14 to control the operations executed by tester 12 and also allows data (e.g., test parameters, DUT responses, etch to pass between tester 12 and computer system 14.

Figure 3:
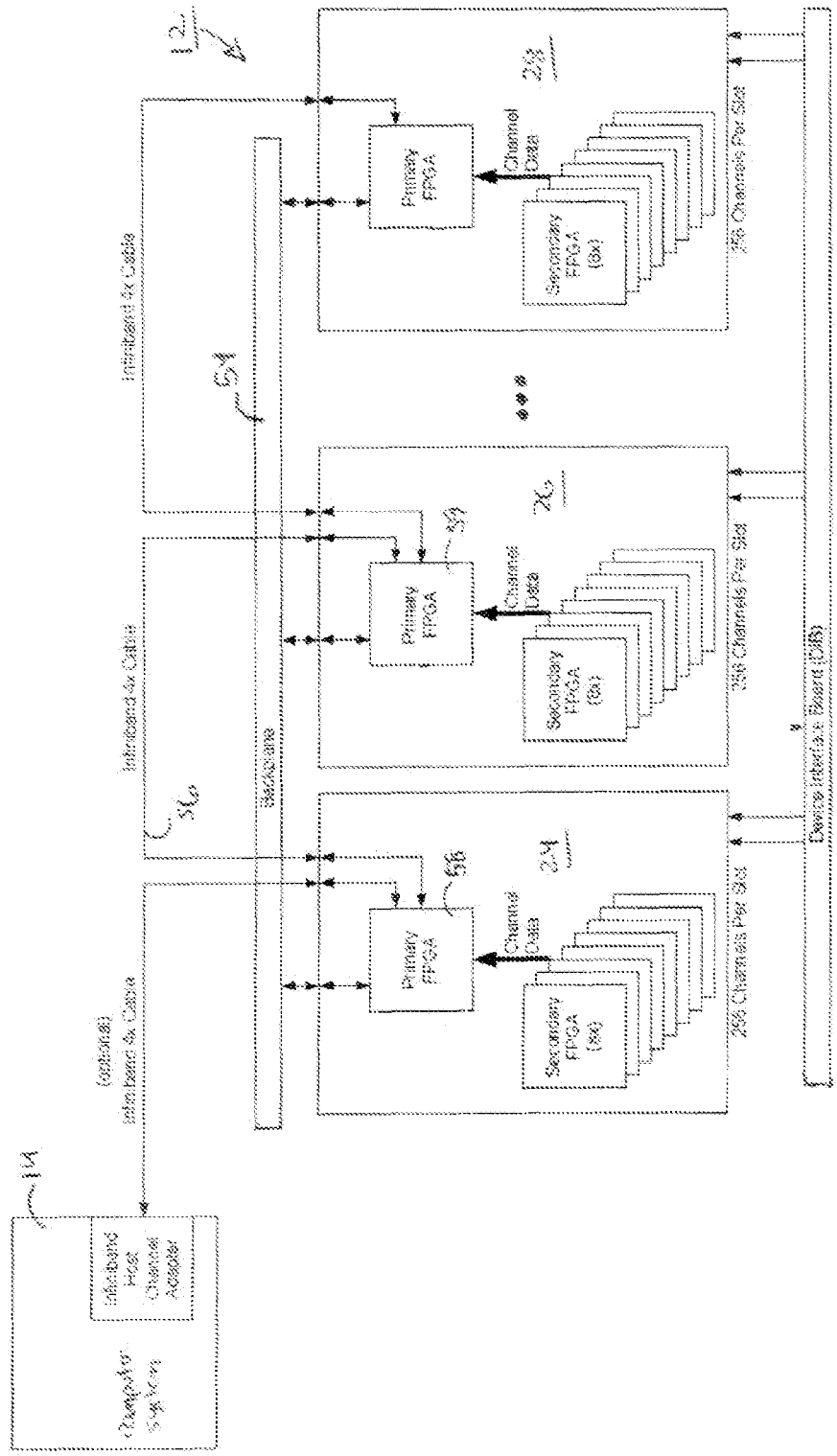
FIG. 3 is a block diagram of test boards in the tester.

Each interlace board 24, 26, 28 may correspond to a test site in the ATE. FIG. 3 shows examples of interface boards 24, 26, 28 which correspond to ATE test sites. Although only three interface boards are shows in FIG. 3, any number of interface boards may be used. In one implementation, for example, twelve interface boards are used. As shown in FIG. 3, each interface board includes a primary field programmable gate array (FPGA) and multiple secondary FPGAs. The secondary FPGAs act as interlaces to DUTs at the sites in that they pass test data to the DUTs, receive test data from the DUTs, and pass the test data to the primary FPGA. The primary FPGA is programmed to operate as a processing device to perform the processing described below.

Each interlace board communicates over one or more communication buses on the backplane 54 of tester 12. In each case, the primary FPGA of an interface board is configured to communicate with primary FPGAs of other interface boards; however, other communication schemes may be used. Each interface board is also capable of communicating with other interface boards over a packet switched network. In this implementation, communications are transmitted over an infiniband 4X cable 56; however, any communications medium may be used instead of, or in addition to, the infiniband 4X cable. One or more interface boards may also communicate with a host processing device, such as computer system 14. In other implementations, the host processing device may be a chip, such as a digital signal processor (DSP), a microprocessor, or other device. Communication may be over the packet switched network, as shown in FIG. 3, or via any other type of communications medium.

In this implementation, each interface board includes 256 slots for electrically connecting to corresponding pins of a DUT. Each pin/slot combination defines a communication channel between the DUT and the interlace board.

Tester 12 may be used to test drivers for liquid crystal display (LCD) devices. These drivers may be used to set light levels, e.g., red, green, blue, and white levels, on an LCD device. In this implementation, the drivers are eight-bit drivers. Therefore, each slot/pin combination may take on one of 256 voltage levels (i.e., 2* voltage levels). These voltage levels are referred to as "codes", which have values from 0 to 255, with 0 being the lowest level, or off, and 255 being the highest level in terms of brightness. It is noted that the following describes testing an LCD driver of this type; however, the ATE and processes described herein are not limited to use with this type of DUT.

An LCD driver being tested may include more than 256 pins. LCD drivers having more than 256 pins may therefore span across more than one interface board. For example, LCD drivers for high-definition (HD) devices typically include 480 pins. Such a device spans across two interface boards 24 and 26 having 256 pin connections each.

During the testing process, an interface board may need to know information from all pins of a DUT, not just from those pins to which the interface board connects. For example, an interface board 24 having 256 pin connections may need to know an average brightness produced by an LCD driver having 480 pins. In order to obtain this information, interface board 24 would need to know the brightness obtained from each of the 480 pins. However, since interlace board 24 only has access to 256 pins, it cannot directly obtain this from all of 480 pins. The process described herein addresses this problem by enabling sharing of information among the interface boards.

By way of example, an interface board 24 receives first test data from a DUT e.g., from the first 256 pins of the DUT. This first test data is processed by interface board 24 (in particular, by FPGA 58) to produce a first partial result. An interface board 26 receives second test data from the DUT, e.g., from the next 224 pins of the DUT (where 224 is the difference between 480 pins and 256 pins). This second test data is processed by interlace beam 26 (in particular, by FPGA 59) to produce a second partial result. The first partial result is sent by interface board 24 to interface board 26; and the second partial result is seat by interface board 26 to interface board 24. Interface board 24 processes the first partial result and the second partial result to produce a test parameter (e.g., an average brightness value across all 480 pins of the DUT). Likewise, interface board 26 processes the first partial result and the second partial result to produce a test parameter, which may be the same test parameter produced by interlace board 24 or a different test parameter (e.g., a maximum brightness value of all 480 pins). The test parameters may be shared among the interface boards and host processing device.

Figure 4:
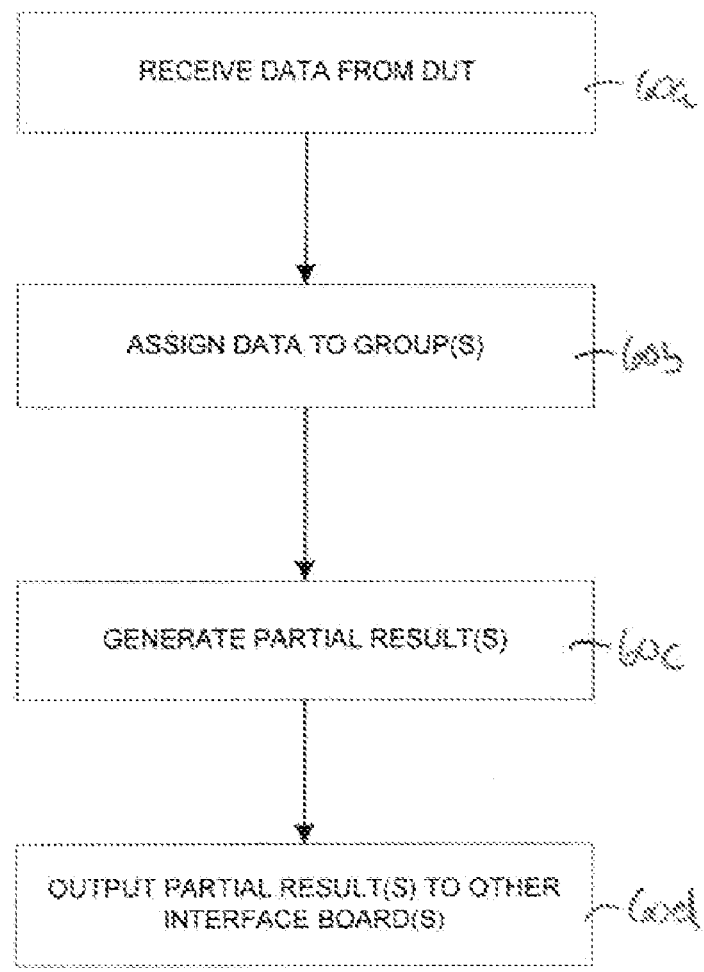
FIG. 4 is a flowchart showing a process for generating partial results in a test board using data received from a DUT in the ATE.

FIG. 4 shows a process 60, which may be performed by each interface board in tester 12. Process 60 is executed to determine a partial processing result for each interface board connected to a OUT (e.g., an LCD driver). In other words, in process 60, data received via the pins of a DUT is processed to produce a partial result that may be distributed to other interface boards. Process 60 is particularly applicable in cases where the number of pins on a DUT exceeds the number of pin connections on an interface board. However, process 60 is also applicable in cases where the number of pins on the DUT is less than or equal to die number of pin connections on the interface board. In this cases, the partial result produced by process 60 is actually the complete result for the DUT.

Referring to FIG. 4, an interface board 24 receives (60*a*) data from the DUT. In this implementation, each of the 256 pin connections of interface board 24 is capable of receiving 256 codes. Each of these codes corresponds to a brightness level of an LCD pixel driven by the LCD driver, where 0 is the lowest brightness and 255 is the highest brightness. Process 60 may be performed to obtain a partial processing result across all pins of the DUT, as explained in more detail below.

In this regard, after receiving codes from the DUT, interface board 24 associates (60*b*) received codes with one or more groups. In this implementation, where the DUT is an LCD driver, the DUT is capable of providing data (codes) for four different colors: red, green, blue and white. Data from the DUT identifies a color for corresponding codes. Interface board 24 receives this information and sorts the codes by color, such that there are four groups, each of which may be identified by a unique group identifier (ID). It is noted that each interface board on the tester uses the same group ID for each color. In this implementation, each pin of a DUT may be a member of two groups, namely red and white, green and white, or blue and white. This means that each pin is capable of transmitting codes for white, some pins are capable of transmitting red, some pins are capable of transmitting green, and some pins are capable of transmitting blue.

Each group may be used to generate partial results, which may be stored in one or more partial results tables, although any other construct may be used for storing the partial results. The number of partial results tables depends, e.g., on the number of groups and on the types of processing required to test the DUT. For example, if an LCD driver is being tested, the tester may be configured to determine, for each group, an average brightness produced by the LCD driver, a minimum brightness produced by the LCD driver, and/or a maximum brightness produced by the LCD driver.

Process 60 generates (60*c*) the partial results by processing test data received from the DUT. For example, primary FPGA 58 may be programmed to generate the partial result. This processing performed to generate the partial result may be cumulative, meaning that new test data may be incorporated into the partial result—to thereby update the partial result—as that new test data is received. For example, FPGA 58 may receive a first code having a value of 10. The first code would thus be the minimum, maximum, average, and sum of all codes received. The number of channels (i.e., pins from which the codes are received) is one. FPGA 58 may receive a second code having a value of 20. In this case, FPGA 58 updates its results so that the minimum is now 10, the maximum is now 20, the average is 15, and the sum is 30. The number of channels is now two. FPGA 58 may receive a third code having a value of 5. In this case, FPGA 58 updates its results so that the minimum is now 5, the maximum is now 20, the average is 10, and the sum is 35. The number of channels is now three. Processing such as this may be performed as codes are received by FPGA 58. To the extent possible, the processing may he performed in parallel. Each result may be stored in one or more partial results tablet(s), which may be resident in memory (not shown) on the interface board. Since the processing is done for codes from each group, group IDs may be stored with each partial result.

During testing, results (e.g., codes) for each pin may vary based on how a voltage is applied. In this implementation, therefore, the same voltage may be applied to each pin four times: once with the pin twisted in a one direction, once with the pin twisted roughly equally and in an opposite direction, once where the voltage progresses from zero to a target voltage, and once where the voltage progresses from a maximum voltage to the target voltage. Partial results, including minimum, maximum, average and sum may be determined, per group, for each of the resulting four measurements, and stored in the partial results tablets). These partial results, may be labeled appropriately.

Interface board 24 outputs (60*d*) its partial results, e.g., minimum, maximum, sum, number of channels, and group (or other) IDs to other interface boards connected to backplane 54. In this regard, each interface board on the tester is programmed with the number of channels of the DUT. This information may be obtained from the DUT or this information may be programmed into the interface boards before testing, e.g., through computer system 14. The number of channels of the DUT, referred to herein as the "expected number of channels", is used by the interface boards in process 62 (FIG. 5) to determine if all partial results have been received, as described below.

Figure 5:
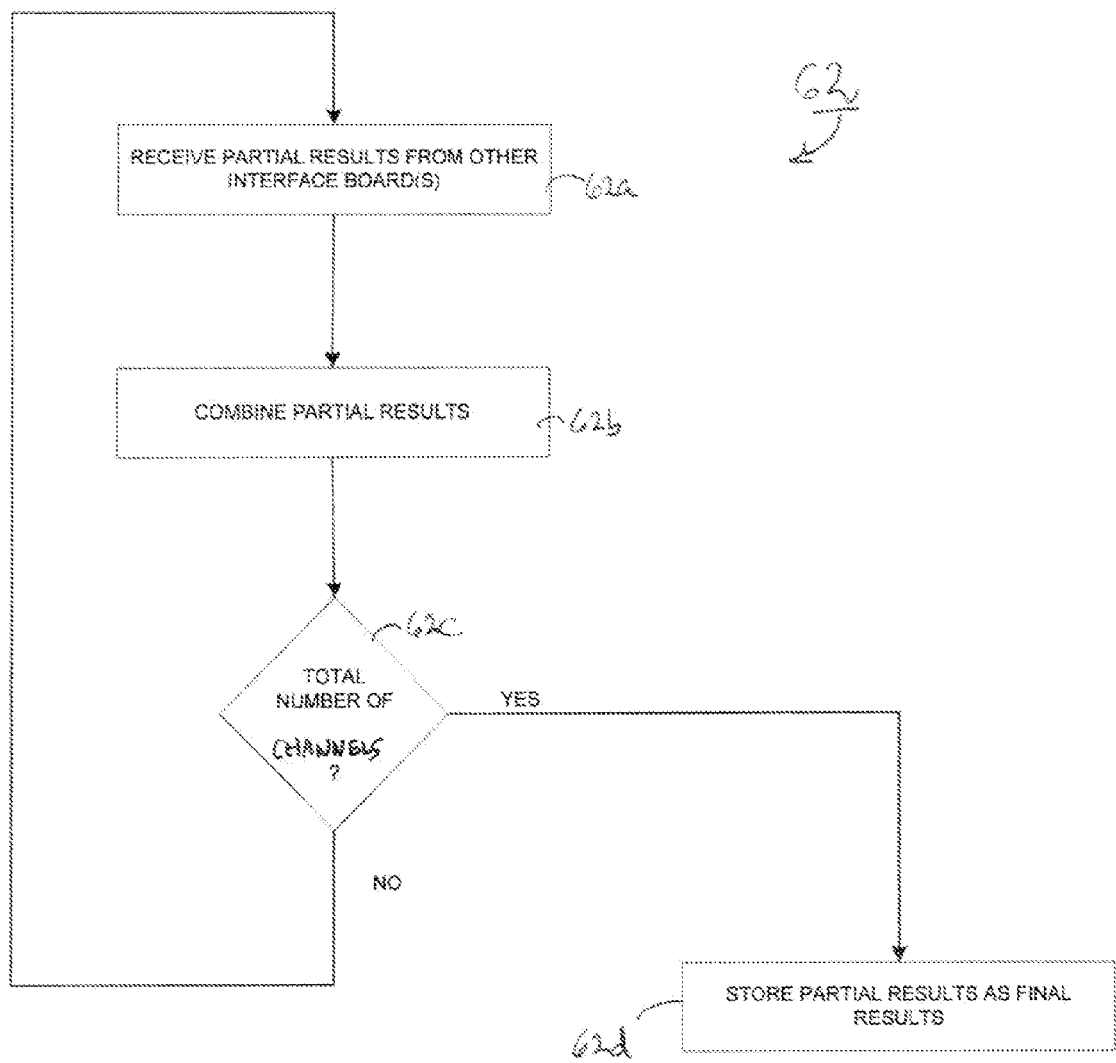
FIG. 5 is a flowchart showing a process for generating one or more test parameters using partial results from one or more test boards.

Referring to FIG. 5, process 62 may be performed by each interface board in tester 12 to determine processing results (e.g., minimum, maximum, average, sum) for all channels of the DUT (e.g., an LCD driver). Process 60 (described above) distributes partial results among multiple test boards so that each test board has a full set of data (e.g., partial results) from which to determine one or more testing parameters.

According to process 62, interface board 24 receives (62*a*) partial results from one or more other interface boards on the tester. In this case, partial results are received from only one interface board (in this example, interface board 26); however, in other implementations, partial results may be received from multiple interlace boards. The partial results may include the minimum, maximum, average, sum, etc. of test data received from interface board 26. The partial results may also include the number of channels from which data is received by interface board 26, and the group IDs of partial results received from the interface board 26.

Interface board 24 combines (62*b*) the partial results from interface board 26 with its own corresponding partial results (i.e., the partial results generated by interlace board 24). The partial results may be combined in partial results tables on interface board 24. Combining, in this context, includes incorporating the partial results from interface board 26 into the partial results generated by interface board 24 in order to obtain a complete set of test data. As noted, if a DUT provides test data to more than two interface boards, partial results must be received from all such interlace boards in order to obtain a complete set of test data. By way of example, FPGA 58 in interlace board 24 receives the partial results from interlace board 24, and updates the maximum, minimum, sum, and average values in the partial results tables on interface board 24.

During or following receipt of the partial results, interface board 24 determines (62*c*) whether the total number of identified channels equals the expected number of channels on the DUT. In this case, the total number of identified channels is the number of channels of the DUT connected to interface board 24 and the number of channels of the DUT connected to interface board 26. As noted, this information is provided as part of the partial results from each interface board. If the total, number of identified channels is equivalent to the expected number of channels on the DUT (62*c*), process 62 identifies (62d) the updated partial results as the final results, stores the final results on interface board 24, and, in some cases, provides the final results to computer system 14. The final results may be test parameters for the DUT (e.g., an average pixel brightness) or may be used by the interface board to generate one or more test parameters for the DUT. If the total number of channels is not equivalent to the number of channels on the DUT (62c), process 62 awaits further partial results data from one or more other interface boards.

As noted above, processes 60 and 62 may be performed in each interface board that is connected to tester 12. This enables each interface board to obtain a complete set of test data from the DUT, and to generate therefrom one or more test parameters for the DUT. In other implementations, processes 60 and 62 need not be performed in each interface board, and may only be performed in select interface board(s).

The process described herein thereinafter "the processes"), are not limited to the hardware and software described above. All or part of the processes can be implemented, at least in part, via a computer program product, e.g., a computer program tangibly embodied in an information carrier, such as one or more machine-readable media or a propagated signal, for execution by, or to control the operation of, one or more data processing apparatus, e.g., a programmable processor, a computer, multiple computers, and/or programmable logic elements.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the processes can be performed by one or more programmable processors executing one or more computer programs to perform the functions of the calibration process. All or part of the processes can be implemented as, special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer include a processor for executing instructions and one or more memory devices for storing instructions and data.

The processes are described herein in the context of testing LCD drivers. It is noted, however, that the processes am not limited to testing LCD drivers, and may be used with any test equipment to test any type of device that may interlace to one or more interface boards in the test equipment.

In alternative implementations, each test board may distribute the actual codes among multiple test boards so that each test board has a full set of data from which to determine one or more testing parameters. The actual codes may be distributed in addition to partial result data or in lieu thereof. These implementations may be useful in eases where a complete set of test data is required by a test board in order to determine a test parameter. For example, a complete set of codes may be needed by a test board to perform statistical analysis, such as standard deviations.

Elements of different embodiments described herein may be combined to form other embodiments not specifically set forth above. Other embodiments not specifically described herein are also within the scope of the following claims.

We claim:

1. An apparatus for testing a device, the apparatus comprising:
   a first site comprising:
      first channels for receiving first test data from the device; and
      a first processing device configured to process the first test data to produce a first partial result;
   a second site comprising:
      second channels for receiving second test data from the device;
      a second processing device configured to process the second test data to produce a second partial result; and
   an electrical connection between the first site and the second site, the electrical connection enabling communication between the first site and the second site;
   wherein the first processing device is configured to receive the second partial result and to use the second partial result and the first partial result to determine a test parameter for the first test data and the second test data.

2. The apparatus of claim 1, wherein the second processing device is configured to receive the first partial result and to use the first partial result and the second partial result to determine the test parameter for the first test data and the second test data.

3. The apparatus of claim 1, further comprising:
   a first circuit board comprising the first site and the first processing device, the first circuit board comprising multiple slots to receive corresponding pins, each of slots corresponding to a channel; and
   a second circuit board comprising the second site and the second processing device, the second circuit board comprising multiple slots to receive corresponding pins, each of slots corresponding to a channel.

4. The apparatus of claim 1, wherein the first test data comprises one to four values per pin, and the first partial result comprises one to four results, the one to four results comprising one result for each of the one to four values of the first test data; and
   wherein the second test data comprises one to four values per pin, and the second partial result comprises one to four results, the one to four results comprising one result for each of the one to four values of the second test data.

5. The apparatus of claim 1, wherein processing performed by the first processing device comprises at least one of taking a minimum of values of the first test data, taking a maximum of values of the first test data, and taking an average of values of the first test data; and
   wherein processing performed by the second processing device comprises at least one of taking a minimum of values of the second test data, taking a maximum of values of the second test data, and taking an average of values of the second test data.

6. The apparatus of claim 1, wherein the first processing device is configured to:
   identify a number of channels on the device;
   obtain a number of channels used to produce the second test data; and
   determine whether an additional partial result is needed to obtain a test parameter for all channels of the device, wherein determining is performed based on the number of channels on the device and the number of channels used to produce the second test data.

7. The apparatus of claim 6, wherein the second processing device is configured to provide, to the first processing device, the number of channels used to produce the second test data.

8. A system for testing a liquid crystal display (LCD) driver, the system comprising:
multiple test boards, each of the multiple test boards comprising multiple channels, the multiple channels corresponding to data channels of the LCD driver;
a device interface board that acts as an interface between the multiple test boards and the LCD driver;
a computing device configured to communicate with the multiple test boards; and
one or more communications buses over which the computing device communicates with the multiple test boards;
wherein each of the multiple test boards is configured to receive partial test data from data channels of the LCD driver, and to process the partial test data to obtain a partial result; and
wherein each of the multiple test boards is configured to share a partial result determined from corresponding partial test data with one or more others of the multiple test boards.

9. The system of claim 8, wherein each of the multiple test boards is configured to process multiple partial results in order to obtain a complete result for the LCD driver, the complete result taking into account test data from channels of different test boards.

10. The system of claim 9, wherein at least one of the multiple test boards is configured to communicate the complete result to the computing device.

11. The system of claim 9, wherein the partial test data corresponding to each of the multiple test boards comprises individual codes per channel, at least some of the individual codes being obtained by applying signals differently to arrive at the codes.

12. The system of claim 11, wherein applying signals differently comprises at least one of obtaining a code by progressing from a maximum signal value to a value of the code, and progressing from a minimum signal value to the value of the code.

13. The system of claim 9, wherein the partial test data corresponding to each of the multiple test boards comprises individual codes per channel, at least some of the individual codes being obtained by different mechanical application of signals to arrive at the codes.

14. The system of claim 9, wherein each of the multiple test boards is configured to process multiple partial results to obtain a test parameter.

15. The system of claim 9, wherein each of the multiple test boards comprises programmable logic configured to process the partial test data to obtain a partial result.

16. A method of testing a device, comprising:
receiving first test data from the device, the first test data being received from a first subset of channels on the device;
processing the first test data at a first test board to produce a first partial result;
receiving second test data from the device, the second test data being received from a second subset of channels on the device;
processing the second test data at a second test board to produce a second partial result;
processing the first partial result and the second partial result at the first test board to produce a first test parameter; and
processing the first partial result and the second partial result at the second test board to produce a second test parameter.

17. The method of claim 16, wherein processing the first partial result and the second partial result comprises at least one of taking minimum of values of the first and second test data, taking maximums of values of the first and second test data, and taking an average of values of the first and second test data.

18. The method of claim 16, wherein the first partial test data and the second partial test data comprises individual codes per channel, at least some of the individual codes being obtained by applying signals differently to arrive at the codes.

19. The method of claim 18, wherein applying signals differently comprises at least one of obtaining a code by progressing from a maximum signal value to a value of the code, and progressing from a minimum signal value to the value of the code.

20. The method of claim 16, further comprising:
in the second test board:
identifying a number of channels on the device;
obtaining a number of channels used to produce the second test data; and
determining whether an additional partial result is needed to obtain a test parameter for all channels of the device, wherein determining is performed based on the number of channels on the device and the number of channels used to produce the second test data.

21. The method of claim 16, wherein the first test parameter and the second test parameter comprise a same test parameter.

22. The method of claim 16, wherein the first test parameter and the second test parameter comprise different test parameters.

23. The system of claim 8, wherein each of the multiple test boards is configured to share partial test data with one or more others of the multiple test boards so that each of the multiple test boards has a complete set of test data for the LCD driver; and wherein at least one of the multiple test boards is configured to process the complete set of test data to obtain a test parameter.

24. An apparatus for testing a device, the apparatus comprising:
a first site comprising:
first channels for receiving first test data from the device; and
a first processing device configured to receive and output the first test;
a second site comprising:
second channels for receiving second test data from the device;
a second processing device configured to receive and output the second test data; and
an electrical connection between the first site and the second site, the electrical connection enabling communication between the first site and the second site;
wherein the first processing device is configured to receive the second test data and to use the second test data and the first test data to determine a first test parameter; and
wherein the second processing device is configured to receive the first test data and to use the first test data and the second test data to determine a second test parameter.

* * * * *

UNITED STATES PATENT AND TRADEMARK OFFICE
CERTIFICATE OF CORRECTION

PATENT NO. : 7,528,623 B2
APPLICATION NO. : 11/670750
DATED : May 5, 2009
INVENTOR(S) : Alexander Zellner and Jeffrey S. Benagh Page 1 of 1

It is certified that error appears in the above-identified patent and that said Letters Patent is hereby corrected as shown below:

In the Claims:

<u>Column 12</u>
Line 49, Claim 24: after "test" insert --data--

Signed and Sealed this
Twentieth Day of August, 2013

Teresa Stanek Rea
*Acting Director of the United States Patent and Trademark Office*